(12) United States Patent
Radle et al.

(10) Patent No.: US 7,944,212 B2
(45) Date of Patent: May 17, 2011

(54) RECEPTACLE TESTER WITH TEXT DISPLAY

(75) Inventors: Patrick J. Radle, Mequon, WI (US);
Anthony W. Gilbert, Waukesha, WI (US); David L. Wiesemann, Pewaukee, WI (US); Daryl C. Brockman, Shorewood, WI (US)

(73) Assignee: Actuant Corporation, Butler, WI (US)

( * ) Notice: Subject to any disclaimer, the term of this patent is extended or adjusted under 35 U.S.C. 154(b) by 259 days.

(21) Appl. No.: 12/393,205

(22) Filed: Feb. 26, 2009

(65) Prior Publication Data

US 2009/0212785 A1    Aug. 27, 2009

Related U.S. Application Data

(60) Provisional application No. 61/067,171, filed on Feb. 26, 2008.

(51) Int. Cl.
*H01H 31/02* (2006.01)

(52) U.S. Cl. .......................... 324/508; 324/555; 324/556
(58) Field of Classification Search ................. 324/598, 324/555, 556
See application file for complete search history.

(56) References Cited

U.S. PATENT DOCUMENTS

| 5,642,502 | A | * | 6/1997 | Driscoll | ............................ 1/1 |
| 6,020,822 | A | | 2/2000 | Marshall | |
| 7,259,567 | B2 | | 8/2007 | Sears et al. | |

* cited by examiner

*Primary Examiner* — Vincent Q Nguyen
(74) *Attorney, Agent, or Firm* — Quarles & Brady LLP (57) ABSTRACT

A tester is disclosed for testing a wiring state of a live electrical receptacle outlet. The tester comprises a body having a display located thereon and a plug extending from the body. The display is configured to selectively provide a text indicator. When the plug of the tester is received in the electrical outlet, the display indicates the wiring state of the electrical outlet.

16 Claims, 8 Drawing Sheets

RECEPTACLE TESTER WITH TEXT DISPLAY

CROSS-REFERENCE TO RELATED APPLICATION

This application claims the benefit of U.S. Provisional Patent Application Ser. No. 61/067,171 entitled "LCD RECEPTACLE TESTER" filed on Feb. 26, 2008, the contents of which are hereby incorporated by reference their entirety.

STATEMENT CONCERNING FEDERALLY SPONSORED RESEARCH OR DEVELOPMENT

Not applicable.

FIELD OF THE INVENTION

The present invention relates to a tester for verifying the correct wiring of an electrical receptacle outlet.

BACKGROUND OF THE INVENTION

Receptacle outlet testers are conventionally used to verify the correct wiring of a wall electrical outlet. Among other things, a receptacle tester can be used to determine whether an outlet is functioning (i.e., would provide power to an attached device) and whether the wiring is safe (i.e., whether improper wiring would result in damage to an attached device or create a situation in which a person may receive an electrical shock).

Figure 1:
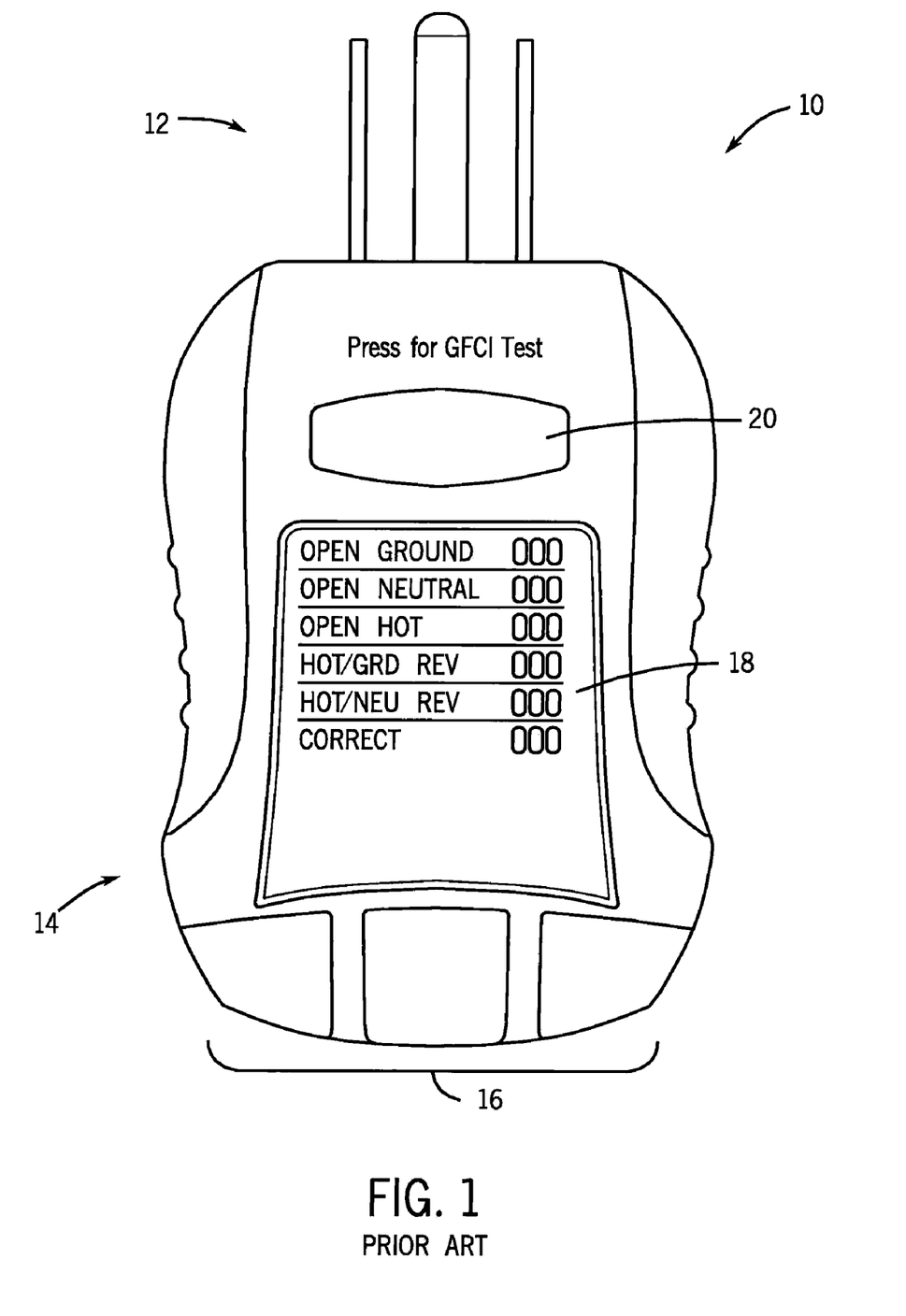
FIG. 1 is a top side view of a prior art receptacle tester.

Conventional receptacle testers, such as the prior art receptacle tester 10 shown in FIG. 1, have a body 14 and a plug 12 that extends from the body 14. The plug 12 includes three prongs (one for hot contact, one for neutral contact, and one for ground contact) for connection in the corresponding receptacles of an electrical outlet. The receptacle tester 10 also has three indicators 16 and a code label 18 located on the body 14. The code label 18 lists the wiring states for each of the indicator combinations. A ground fault circuit interrupter tester, such as a button 20, is also available on the receptacle tester 10.

When the plug 12 of the receptacle tester 10 is plugged into a live outlet, one or more of the indicators 16 may light up indicating the wiring status of the outlet. The user compares the on/off pattern of the three indicators 16 to the code label 18 to determine whether the outlet is correctly wired. If the outlet is not correctly wired, then the code label 18 indicates what is incorrect about the wiring so that the user may make the necessary changes before the outlet is put into service.

However, under certain conditions, it can be difficult for the user to read the code label or see the indicator lights. Since receptacle testers are generally quite compact, the text printed on the code label is frequently small—making the code label difficult to read. Additionally, as at least the outlet being tested is not in service, the receptacle tester is often being used in a poorly lit area. Moreover, as not all outlets are similarly oriented, upon insertion of the receptacle tester in the outlet, it may be difficult for the user to consult the code label or see the indicators, particularly if the outlet is upside-down.

Hence, there is a need for an improved receptacle tester that provides easy analysis of the output provided by the receptacle tester and that can be used on outlets having various orientations.

SUMMARY OF THE INVENTION

A tester is disclosed for testing a wiring state of a live electrical receptacle outlet. The tester includes a body having a display located thereon and a plug extending from the body. The display is configured to selectively provide a text indicator. When the plug of the tester is received in the electrical outlet, then the display indicates the wiring state of the electrical outlet.

In one form of the tester, the display may be a liquid crystal display.

In another form of the tester, the display may be located on a surface of the body of the tester opposite to a surface of the body from which the plug extends. In this form, when the plug is inserted into an outlet for testing, the display is on a plane generally parallel with a plane on which the electrical outlet is located.

In yet another form, the tester may further include a sensor configured to detect the spatial orientation of the tester relative to a direction of gravity. In this form, the display is configured to orient a text message displayed on the text indicator based on the spatial orientation of the tester.

In still yet another form, the tester may further include a level mounted to a surface of the body of the tester. In some forms, the level may be a bubble level.

In other forms, the plug extending from the body may have a plurality of prongs. The plurality of prongs may include two flat prongs and a round prong. In this form, one of the flat prongs may be polarized relative to the other flat prong and the round prong may be a ground.

In one form, the tester further may include a ground fault circuit interrupter tester.

In another form, the display of the tester may be powered by a battery.

In still yet another form, the body of the tester may further include a rotational joint between the display and the plug. In some forms, the rotational joint may be located between the display and at least a portion of the body. In one form, an axis of rotation between the display and the body may be substantially parallel with a direction of insertion of the plug. In another form, the axis of rotation between the display and the body may be substantially perpendicular with a direction of insertion of the plug.

In another form, the tester may include a first half of the body including the plug and a second half of the body including the display. The rotational joint may be located between the first half and the second half of the body.

In still another form, when the plug of the tester is received in the electrical outlet, the display may indicate the wiring state of the electrical outlet by providing a text message on the text indicator.

Thus, a tester is disclosed that provides easy analysis of the wiring status of an outlet by a text display. Instead of comparing indicator lights to a code label or the like, the user may simply consult the display which provides a text message indicating the wiring status. The user does not need to take the additional mental step of comparing an indicator light sequence to a code label. Further, in many forms of the disclosed tester, the display is either rotatable or senses the spatial orientation of the tester to orient the text message in a more readable way to the user.

These and still other advantages of the invention will be apparent from the detailed description and drawings. What follows is merely a description of some preferred embodiments of the present invention. To assess the full scope of the invention the claims should be looked to as these preferred embodiments are not intended to be the only embodiments within the scope of the claims.

DETAILED DESCRIPTION OF THE PREFERRED EMBODIMENTS

Figure 2:
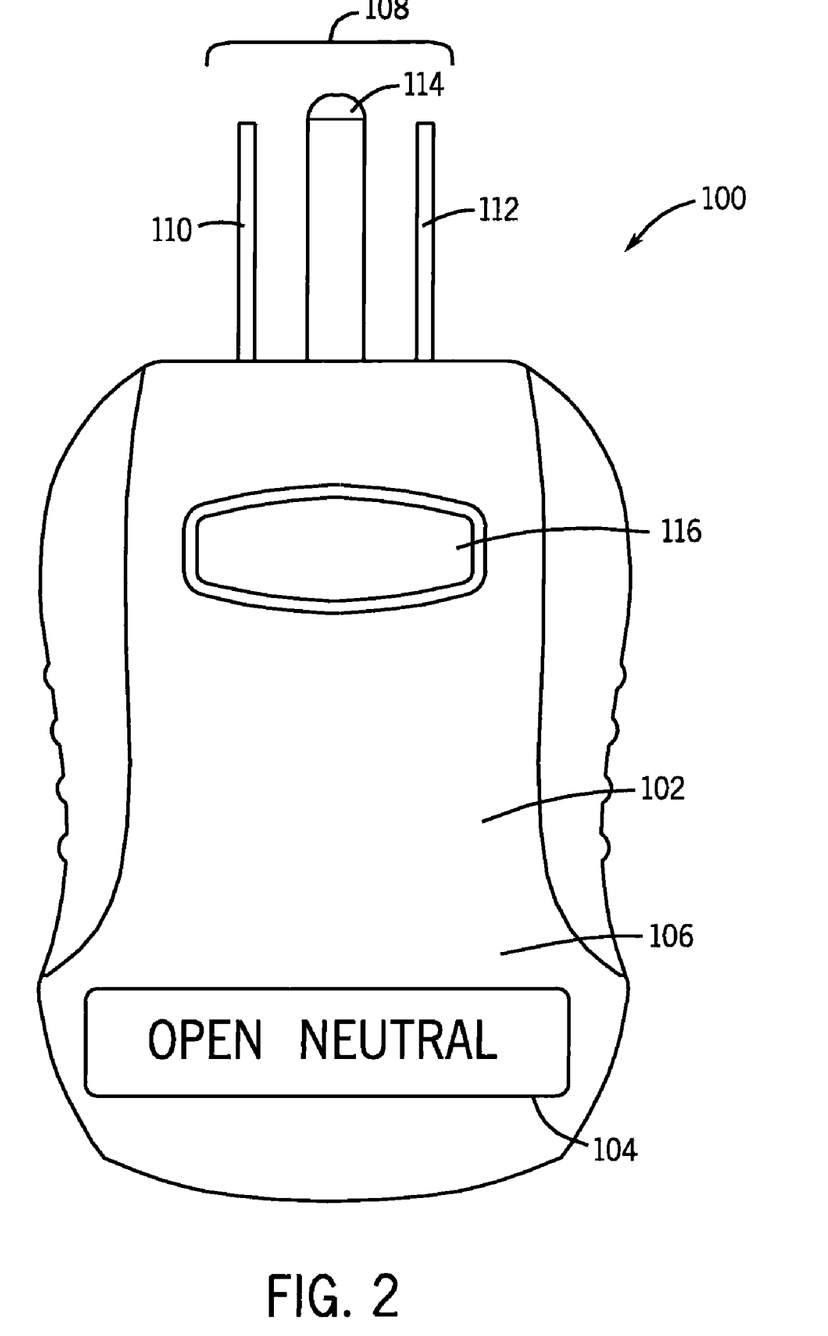
FIG. 2 is a top side view of a receptacle tester having a text display.

Referring to FIG. 2, a receptacle tester 100 has a body 102 with a liquid crystal display 104 located on a surface 106 of the body 102. The liquid crystal display 104 is designed such that it is capable of providing a text indicator. A plug 108 extends from the body 102 and includes two flat prongs 110 and 112 and a ground prong 114. A button 116 is also located on the surface 106. The button 116 serves as a ground fault circuit interrupter (GFCI) tester.

The receptacle tester 100, when plugged into an outlet, displays the wiring state of the outlet on the liquid crystal display 104. As shown in FIG. 2, an "OPEN NEUTRAL" wiring state is displayed. It is contemplated that other wiring states may be displayed on the liquid crystal display 104 including, but not limited to, "OPEN GROUND", "OPEN HOT", "HOT/GRD REV", "HOT/NEU REV", and "CORRECT". Because the wiring state is displayed directly onto the liquid crystal display 104, the user does not need to reference a code label to interpret the indicators common to standard receptacle testers. Moreover, the font size of the text on the liquid crystal display 104 can be much larger than the font size commonly found on code labels, as only a single wiring state needs to be displayed at a time. Thus, the liquid crystal display 104 displays the wiring state in an easily readable manner. The liquid crystal display 104 could also be configured to display the wiring state in one or more languages simultaneously or to be toggled between one or more languages using a control or the like.

As most liquid crystal displays are powered by direct current (DC) and most outlets provide alternating current (AC), it may be necessary to use a liquid crystal display 104 that can be powered using alternating current, convert the alternating current into a direct current usable by the display, or power the liquid crystal display 104 using a separate battery. If a separate battery is added, it is contemplated that "DEAD" or a similar phrase may be displayed on the liquid crystal display 104 as the battery runs out of energy to indicate that the battery needs to be changed.

Although the receptacle tester 100 is described as having a liquid crystal display 104, any display suitable for display of a text message could be used. The display could be monochromatic or multi-colored and may optionally be electroluminescent or have backlighting to improve readability of the display, particularly in dark or dimly lit areas.

Further, the plug 108 may be any one of a number of different types of plugs. Although the plug 108 is shown as being a Type-B plug (American 3-pin or U-ground), other plugs may be used based on regional or national standards.

Figures 3A, 3B:
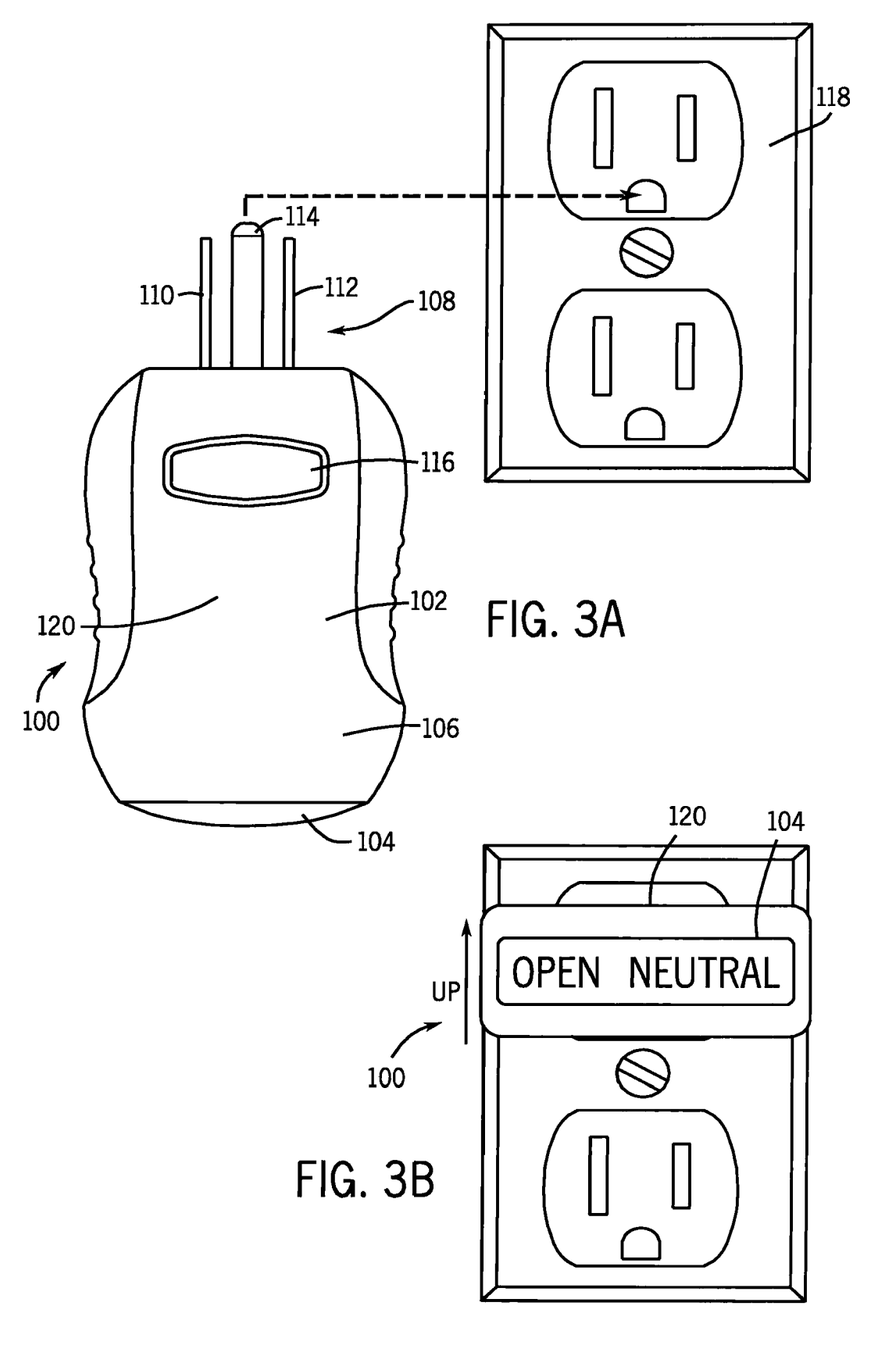
FIG. 3A is an alternative form of the receptacle tester in which the display is located on the front side of the receptacle tester and the receptacle tester is being plugged into an outlet having a typical orientation.
FIG. 3B is a front side view of the receptacle tester of FIG. 3A after being plugged into the outlet.

Referring now to FIGS. 3A and 3B, the plug 108 of the receptacle tester 100 is shown as being inserted into an outlet 118 having a typical orientation (two prongs on top and a single ground prong on the bottom). The side of the receptacle tester 100 having the GFCI button 116 will be referred to as the top side 120 of the receptacle tester 100. Notably, in the form shown in FIGS. 3A and 3B, the liquid crystal display 104 is located on the front side of the receptacle tester 100 such that it is located on the opposite side of the receptacle tester 100 relative to the plug 108. Thus, when the plug 108 is plugged into an outlet 118 on a vertical surface, the liquid crystal display 104 is on a plane generally parallel to the plane on which the outlet 118 is located. As shown in FIG. 3B, the liquid crystal display 104 displays the wired status of the outlet 118 such that it is readable to an upright viewer.

Figures 4A, 4B:
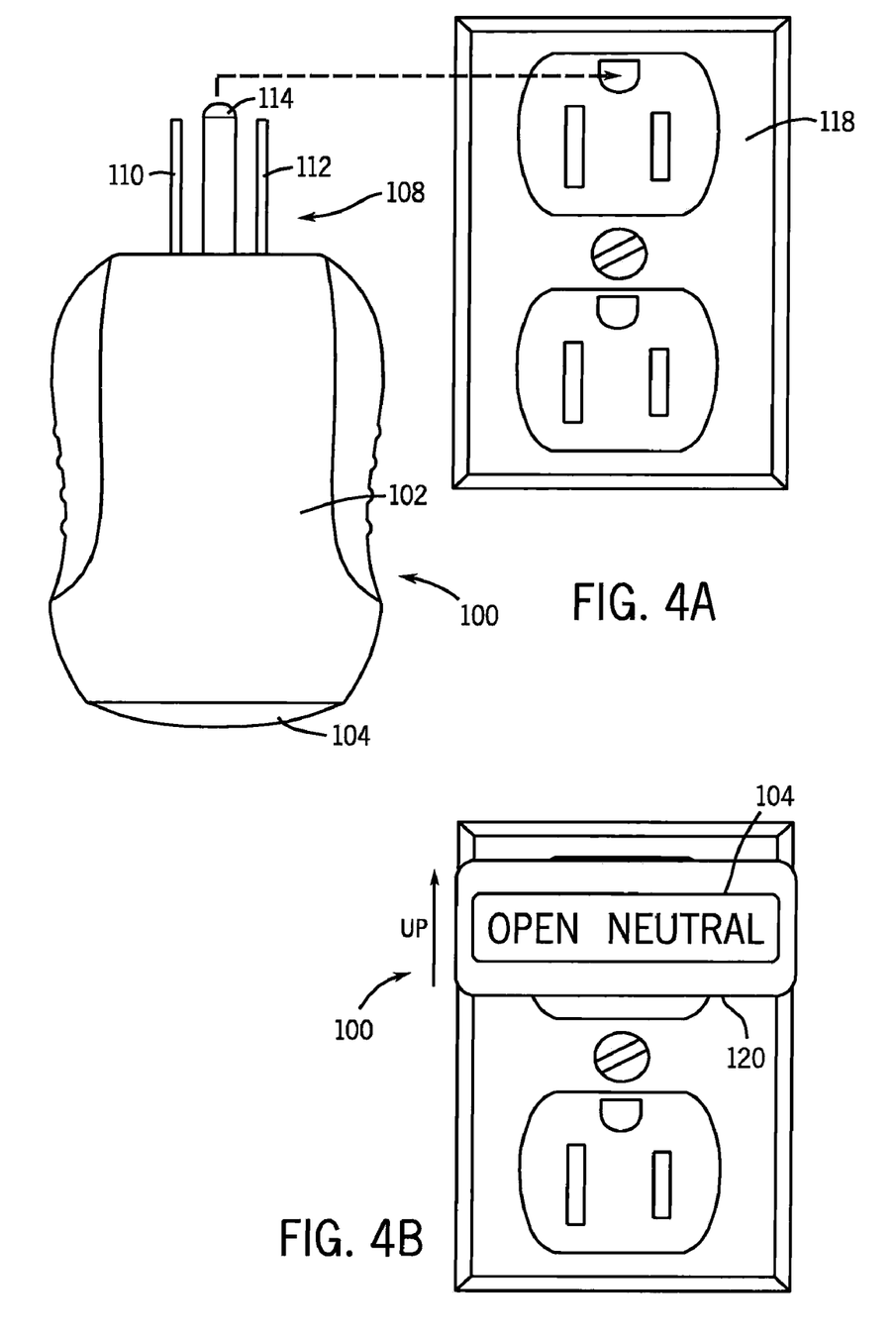
FIG. 4A is a view of the receptacle tester of FIGS. 3A and 3B being plugged into an outlet having a reverse orientation.
FIG. 4B is a front side view of the receptacle tester of FIG. 4A after being plugged into the outlet.

Referring now to FIGS. 4A and 4B, the plug 108 of the receptacle tester 100 of FIGS. 3A and 3B is inserted into an outlet 118 having a reversed or upside-down orientation (a single ground prong on top and two flat prongs on the bottom). As can be seen in FIG. 4B, the top side 120 of the receptacle tester 100 faces downward when plugged into the outlet having this upside down or reversed orientation. As will be described in more detail below, a sensor 134 inside the receptacle tester 100 detects the spatial orientation of the sensor 134 relative to the direction of gravity (which is opposite the UP direction indicated in FIGS. 3B and 4B).

Figure 8:
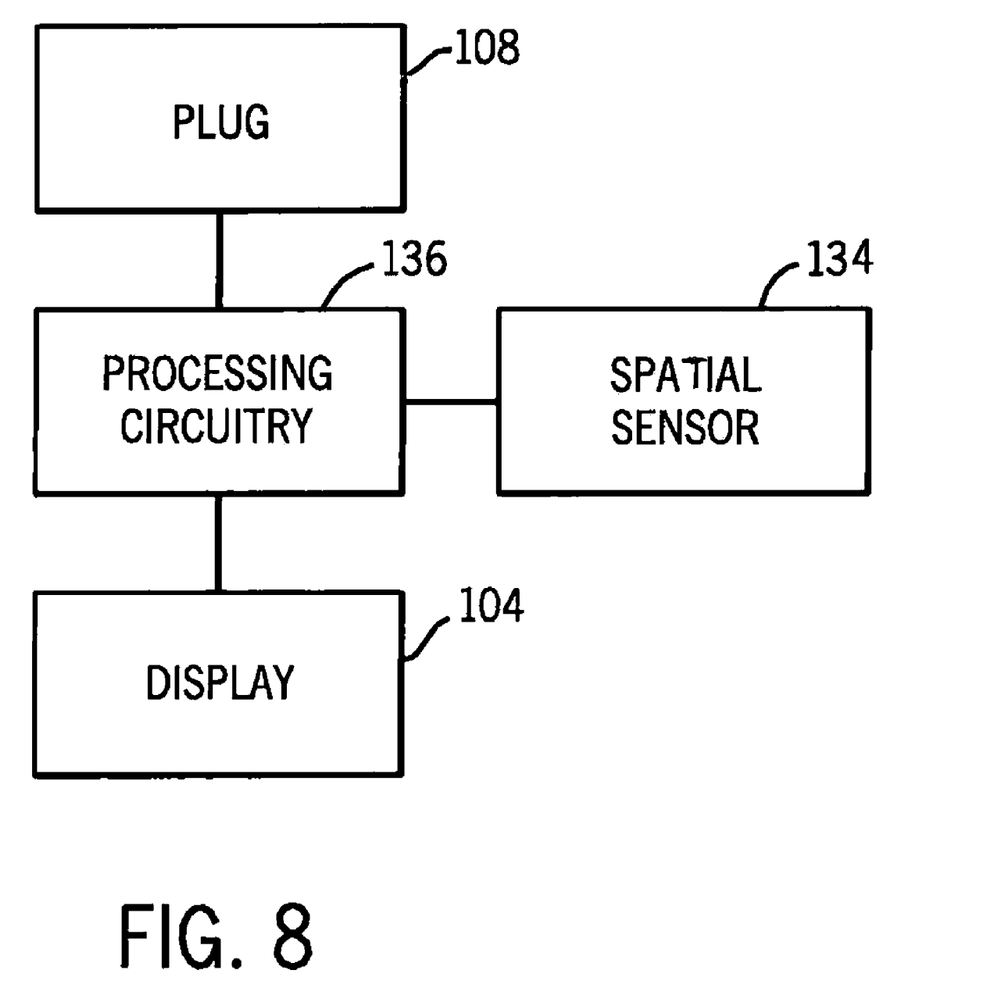
FIG. 8 is a schematic of the receptacle tester.

With additional reference to the schematic of FIG. 8 depicting the functional portions of the receptacle tester 100, when the receptacle tester 100 inserted into an upside-down outlet as in FIGS. 4A and 4B, the spatial sensor 134 determines that the receptacle tester 100 is turned upside-down. The processing circuitry 136 inside the receptacle tester 100 receives this information from the spatial sensor 134 and orients the text displayed on the liquid crystal display 104 such that the text is oriented in the UP direction. Thus, in FIG. 4B, the displayed text has been flipped 180 degrees, such that it can still be easily read by a user viewing the display 104 from an upright position.

In this way, the liquid crystal display 104 is easily read regardless of the orientation of the receptacle tester 100. In contrast, when the prior art receptacle indicator 10 is plugged into the outlet 118 having the upside-down or reversed orientation, a user would have difficulty observing either the code label 18 or the indicators 16.

In some forms, the receptacle tester 100 may have moveable parts such that the orientation of the liquid crystal display 104 relative to the plug 108 may be manually adjusted by twisting, rotating, and/or otherwise moving different parts of the receptacle tester 100 relative to one another. Depending on the specific structure of the receptacle tester 100, it may be desirable to place mechanical restrictions on the range of rotation such that, for example, wires connecting the parts are not damaged during the rotation of the liquid crystal display 104 relative to the plug 108.

Figure 7A:
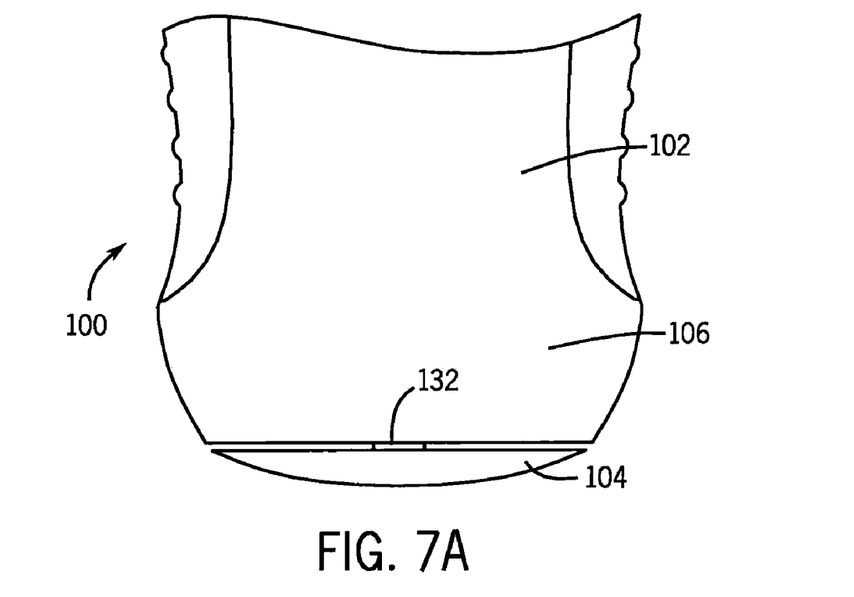
FIG. 7A is a top view of another form of the receptacle tester in which there is a rotatable joint between the display and the body of the receptacle tester.

For example, in one form, such as is shown in FIG. 7A, a rotational joint 132 may connect the liquid crystal display 104 to the rest of the body 102 such that the display 104 can be swiveled relative to the body 102.

Figure 7B:
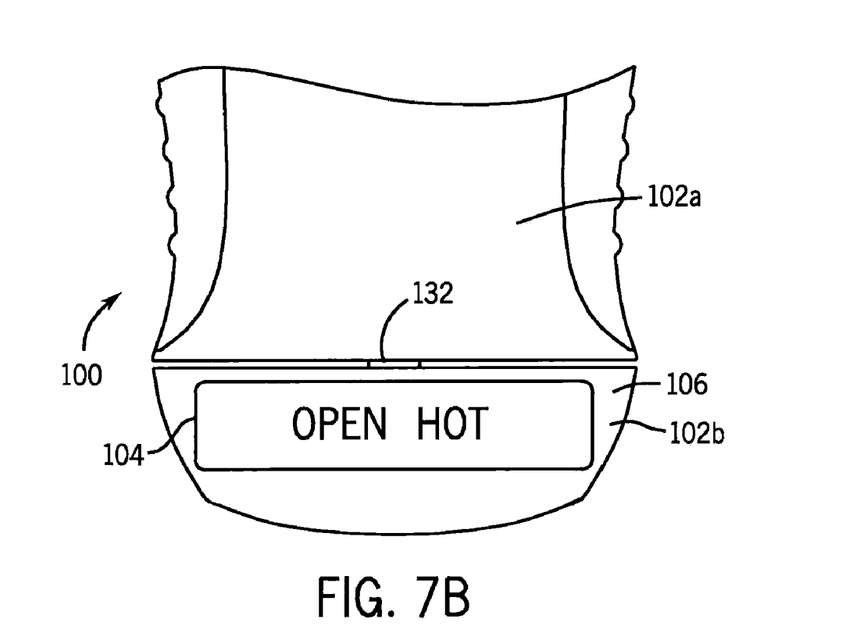
FIG. 7B is a top view of yet another form of the receptacle tester in which there is a rotatable joint between the two sections of the body of the receptacle tester.

In another form, such as is shown in FIG. 7B, the body 102 may be bifurcated such that the plug 108 may be on one portion 102a of the body 102 and the liquid crystal display 104 may be on another portion 102b of the body 102. For easy viewing by the user, the portions 102a and 102b may be connected at a rotational joint 132 such that the liquid crystal display 104 can be rotated relative to the plug 108 along an axis of plug insertion. As shown in FIG. 7B, the display 104 is located on a surface of the body portion 102b that is easily viewable from the top or bottom of the receptacle tester 100, depending on the rotation. However, the display 104 could also be located on the front face of the receptacle test similar to FIGS. 3-6.

Figure 7C:
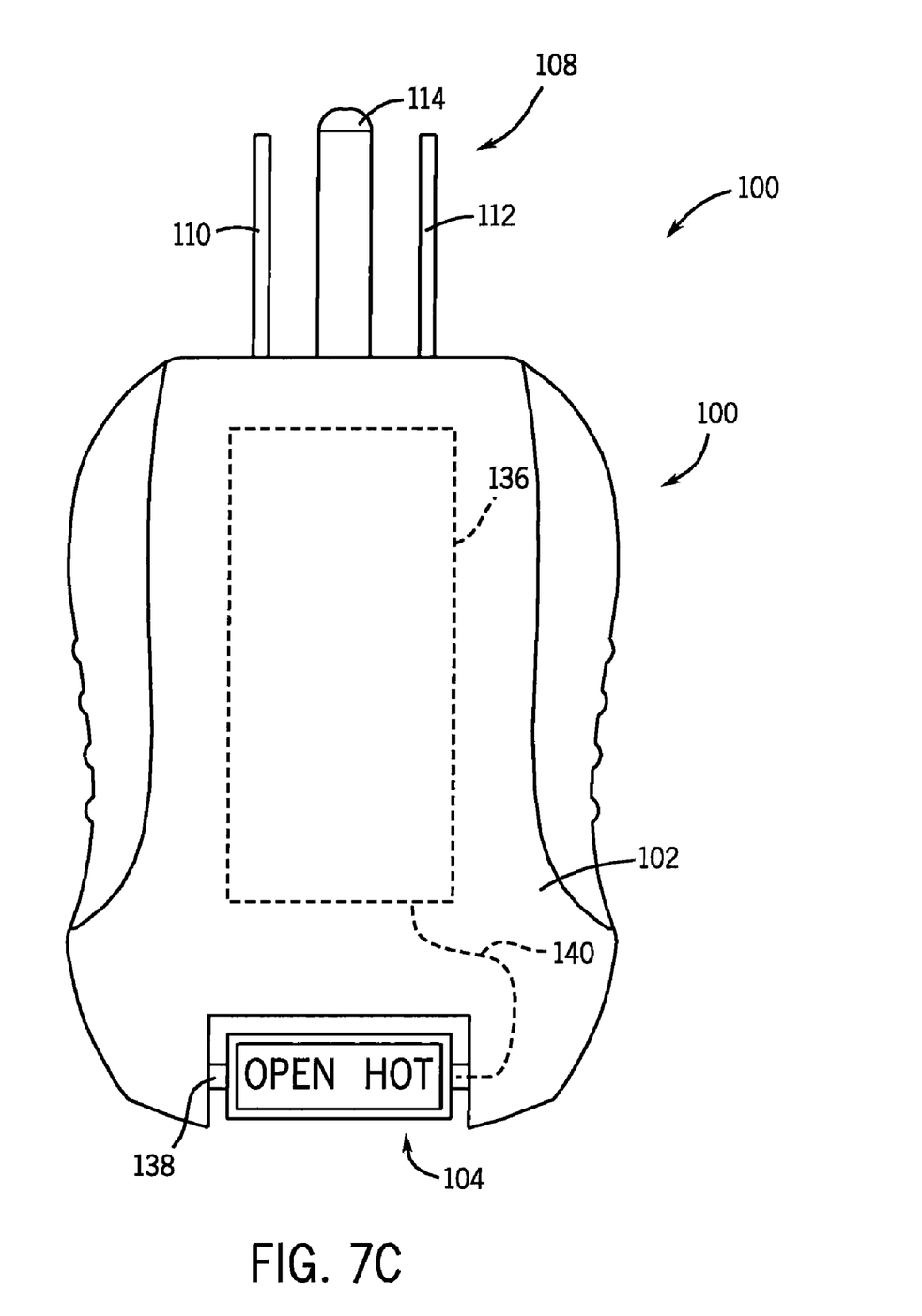
FIG. 7C is a top view of still yet another form of the receptacle tester having a rotatable text display in which the axis of rotation is in a direction perpendicular to the direction of plug insertion.

In still yet another form, such as is shown in FIG. 7C, the display 104 is swivelable relative to the body 102 of the receptacle tester 100 about a rotary axis perpendicular to the axis of plug insertion. A pair of joints 138 rotatably connect the display 104 to the body 102 of the receptacle tester. At least one of the pair of joints 138 may be hollow such that a wire 140 can connect the display 104 to the processing circuitry 136.

In operation of the embodiment shown in FIG. 7C, the user inserts plug 108 into an electrical outlet. Then, depending on the orientation of the outlet, the user can rotate the display 104 to a preferred viewing angle. The orientation of the displayed text may be based at least in part upon a spatial sensor 134. Further, the orientation could be based at least in part upon a detected orientation of the display 104 relative to the body 102.

Figure 5:
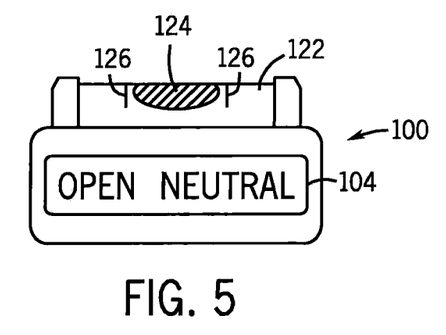
FIG. 5 is a front side view of another form of the receptacle tester in which the receptacle tester further includes a bubble level.
Figure 6A:
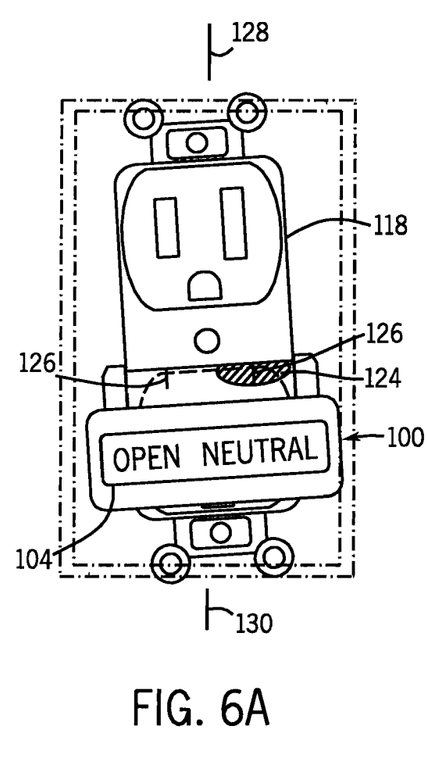
FIG. 6A is a front view of the receptacle tester having a bubble level, as in FIG. 5, inserted into an outlet that is not vertically aligned.
Figure 6B:
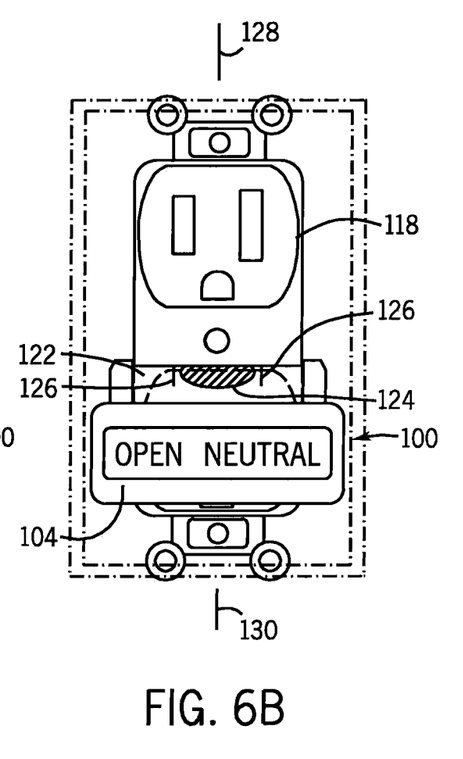
FIG. 6B is a front view of the receptacle tester having a bubble level, as in FIG. 5, inserted into an outlet that is vertically aligned.

Yet another embodiment of the receptacle tester 100 is shown in FIGS. 5, 6A, and 6B. In this embodiment, a bubble level 122 having a bubble 124 and center marks 126 is placed on one of the faces of the receptacle tester 100. As in FIGS. 3A, 3B, 4A, and 4B, the liquid crystal display 104 is located on the front face of the receptacle tester 100.

When the receptacle tester 100 is plugged into an outlet, the bubble level 122 can be used to determine whether the outlet is properly aligned or not. For example, in FIG. 6A, which has vertical reference lines 128 and 130, the bubble 124 in the bubble level 122 is off-center (i.e., outside of the center marks 126) as the outlet 118 is not vertically aligned. In contrast, in FIG. 6B, the outlet 118 is properly vertically aligned with vertical reference lines 128 and 130 and the bubble 124 is within the center marks 126.

The level is not restricted to being only a bubble level and may be operable whether or not a current is being supplied to the outlet 118. It is further contemplated that the sensor used to detect the orientation of the receptacle tester may serve as a level and the display 104 may indicate whether or not the outlet is level.

The inclusion of a level permits an outlet to be oriented in a particular direction with precision. Since outlet fixtures do not commonly have long flat surfaces that can be used to level the outlets using traditional levels, the receptacle tester 100, when plugged into the outlet 118, provides a point of engagement for use as a reference point in aligning the outlet.

Although the attempted vertical alignment of an outlet 118 is shown in FIGS. 6A and 6B, one or more levels may be placed on the various surfaces of the receptacle tester 100 to align the outlet along a direction other than the vertical direction. For example, a level may be placed at a 90 degree angle from the bubble level 122 shown in FIGS. 6A and 6B to orient an outlet along a horizontal direction.

Preferred embodiments of the invention have been described in considerable detail. Many modifications and variations to the preferred embodiments described will be apparent to a person of ordinary skill in the art. Therefore, the invention should not be limited to the embodiments described.

We claim:

1. A tester for testing a wiring state of a live electrical receptacle outlet, the tester comprising a body having a display located thereon and a plug extending from the body, the display configured to selectively provide a text indicator and wherein, when the plug of the tester is received in the electrical outlet, the display indicates the wiring state of the electrical outlet, the wiring state being selected from a group of wiring states including open neutral, open ground, open hot, hot/ground reversed, hot/neutral reversed, and correct.

2. The tester of claim 1, wherein the display is a liquid crystal display.

3. The tester of claim 1, wherein the display is located on a surface plane of the body of the tester opposite to the plug extends, such that, when the plug is inserted into an outlet for testing, the plane of the display is perpendicular with a plane on which the electrical outlet is located.

4. The tester of claim 3, wherein the tester further comprises a sensor configured to detect the spatial orientation of the tester relative to a direction of gravity and wherein the display is configured to orient a text message displayed on the text indicator based on the spatial orientation of the tester.

5. The tester of claim 1, further comprising a level mounted to a surface of the body of the tester.

6. The tester of claim 5, wherein the level is a bubble level.

7. The tester of claim 1, wherein the plug extending from the body has a plurality of prongs.

8. The tester of claim 7, wherein the plurality of prongs includes two flat prongs and a round prong, one of the flat prongs being polarized relative to the other flat prong and the round prong being a ground.

9. The tester of claim 1, further comprising a ground fault circuit interrupter tester.

10. The tester of claim 1, wherein the display of the tester is powered by a battery.

11. The tester of claim 1, wherein the body of the tester further comprises a rotational joint between the display and the plug.

12. The tester of claim 11, wherein the rotational joint is located between the display and at least a portion of the body.

13. The tester of claim 12, wherein an axis of rotation between the display and the body is substantially parallel with a direction of insertion of the plug.

14. The tester of claim 12, wherein the axis of rotation between the display and the body is substantially perpendicular with a direction of insertion of the plug.

15. The tester of claim 11, further comprising a first half of the body including the plug and a second half of the body including the display with the rotational joint being located between the first half and the second half of the body.

16. The tester of claim 1, wherein, when the plug of the tester is received in the electrical outlet, the display indicates the wiring state of the electrical outlet by providing a text message on the text indicator.

\* \* \* \* \*